US010046372B2

(12) United States Patent
Goda et al.

(10) Patent No.: US 10,046,372 B2
(45) Date of Patent: Aug. 14, 2018

(54) LIQUID PROCESSING APPARATUS

(71) Applicant: Tokyo Electron Limited, Tokyo (JP)

(72) Inventors: Kazuya Goda, Kumamoto (JP);
Yoshifumi Amano, Kumamoto (JP);
Nobuya Yamamoto, Kumamoto (JP);
Go Ayabe, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 15/209,982

(22) Filed: Jul. 14, 2016

(65) Prior Publication Data

US 2017/0028450 A1 Feb. 2, 2017

(30) Foreign Application Priority Data

Jul. 29, 2015 (JP) ................................. 2015-149512

(51) Int. Cl.
  *B08B 13/00* (2006.01)
  *B08B 3/04* (2006.01)
  *H01L 21/67* (2006.01)
(52) U.S. Cl.
  CPC .......... *B08B 13/00* (2013.01); *H01L 21/6708* (2013.01); *H01L 21/67017* (2013.01); *H01L 21/67028* (2013.01)
(58) Field of Classification Search
  CPC ............... B08B 13/00; H01L 21/67017; H01L 21/67028; H01L 21/6708
  See application file for complete search history.

(56) References Cited

U.S. PATENT DOCUMENTS

| 6,752,872 B2* | 6/2004 | Inada ................... B05D 3/0486 |
| | | 118/300 |
| 9,073,103 B2* | 7/2015 | Morita ................. B08B 15/002 |
| 2007/0212884 A1* | 9/2007 | Yamamoto ............... G03F 7/11 |
| | | 438/694 |
| 2010/0040779 A1* | 2/2010 | Nagamine ............... G03F 7/162 |
| | | 427/240 |
| 2010/0232781 A1* | 9/2010 | Hontake ............... G03F 7/0035 |
| | | 396/611 |

(Continued)

FOREIGN PATENT DOCUMENTS

JP 2012-190823 A 10/2012

*Primary Examiner* — Michael Barr
*Assistant Examiner* — Benjamin L Osterhout
(74) *Attorney, Agent, or Firm* — Abelman, Frayne & Schwab

(57) ABSTRACT

A liquid processing apparatus includes a plurality of liquid processing units, a plurality of individual exhaust paths, a common exhaust path, a first outside air intake section, a first regulation valve, a second outside air intake section, and a second regulation valve. The liquid processing units perform a liquid processing on a processing target object. An exhaust gas from an inside of the liquid processing unit flows in the individual exhaust paths. The exhaust gas from the individual exhaust paths flows in the common exhaust path. The first outside air intake section is formed at the most upstream side to introduce outside air. The first regulation valve is provided in the first outside air intake section. The second outside air intake section is formed at a downstream side of the common exhaust path from the connection. The second regulation valve is provided in the second outside air intake section.

10 Claims, 10 Drawing Sheets

(56) References Cited

U.S. PATENT DOCUMENTS

| | | | |
|---|---|---|---|
| 2011/0087378 A1* | 4/2011 | Kim | C23C 14/564 700/282 |
| 2012/0227768 A1* | 9/2012 | Morita | B08B 15/002 134/18 |
| 2012/0234356 A1* | 9/2012 | Nishi | H01L 21/02052 134/21 |

* cited by examiner

| NUMBER OF COMMUNICATING PROCESSING UNITS | OPENING DEGREE OF FIRST REGULATION VALVE | OPENING DEGREE OF SECOND REGULATION VALVE |
|---|---|---|
| 5 | 0 | 0 |
| 4 | $\alpha 0$ | 0 |
| 3 | $\alpha$ | 0 |
| 2 | $\alpha$ | $\alpha 0$ |
| 1 | $\alpha$ | $\alpha$ | even
LIQUID PROCESSING APPARATUS

CROSS-REFERENCE TO RELATED APPLICATIONS

This application is based on and claims priority from Japanese Patent Application No. 2015-149512 filed on Jul. 29, 2015 with the Japan Patent Office, the disclosure of which is incorporated herein in its entirety by reference.

TECHNICAL FIELD

Disclosed exemplary embodiments relate to a liquid processing apparatus.

BACKGROUND

Conventionally, a liquid processing apparatus is known which performs various kinds of liquid processings on a processing target object such as, for example, a silicon wafer or a compound semiconductor wafer, using a processing liquid such as, for example, an alkali processing liquid or an acid processing liquid (see, e.g., Japanese Patent Laid-open Publication No. 2012-190823).

The liquid processing apparatus according to the related art includes a plurality of liquid processing units in which a liquid processing is performed, and is configured such that the exhaust gases from the plurality of liquid processing units are discharged all at once through a common exhaust path. Meanwhile, an exhaust mechanism such as, for example, a pump is connected to the common exhaust path, and an exhaust amount of the common exhaust path is maintained constant in order to suppress the pressure of each liquid processing unit from being fluctuated at a timing where a liquid processing is performed.

SUMMARY

A liquid processing apparatus according to an exemplary embodiment of the present disclosure includes a plurality of liquid processing units, a plurality of individual exhaust paths, a common exhaust path, a first outside air intake section, a first regulation valve, a second outside air intake section, and a second regulation valve. Each of the plurality of liquid processing units performs a liquid processing on a processing target object by supplying a processing liquid to the processing target object. Each of the plurality of individual exhaust paths is connected to one of the liquid processing units at one end thereof so that an exhaust gas from an inside of the liquid processing unit flows in the individual exhaust paths. The other end of each of the individual exhaust paths is connected to the common exhaust path so that the exhaust gas from the individual exhaust paths flows in the common exhaust path. The first outside air intake section is formed at a most upstream side, in the common exhaust path in a flow direction of the exhaust gas, from a plurality of connection regions, to which the individual exhaust paths are connected, and introduces outside air into the common exhaust path. The first regulation valve is provided between the first outside air intake section and the connection region, which is located at a most upstream side among the connection regions, and regulates a flow rate of the outside air introduced from the first outside air intake section. The second outside air intake section is formed at a downstream side of the common exhaust path from the connection region, which is located at the most upstream side among the connection regions, and introduces outside air into the common exhaust path. The second regulation valve is provided in the second outside air intake section, and regulates a flow rate of the outside air introduced from the second outside air intake section.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
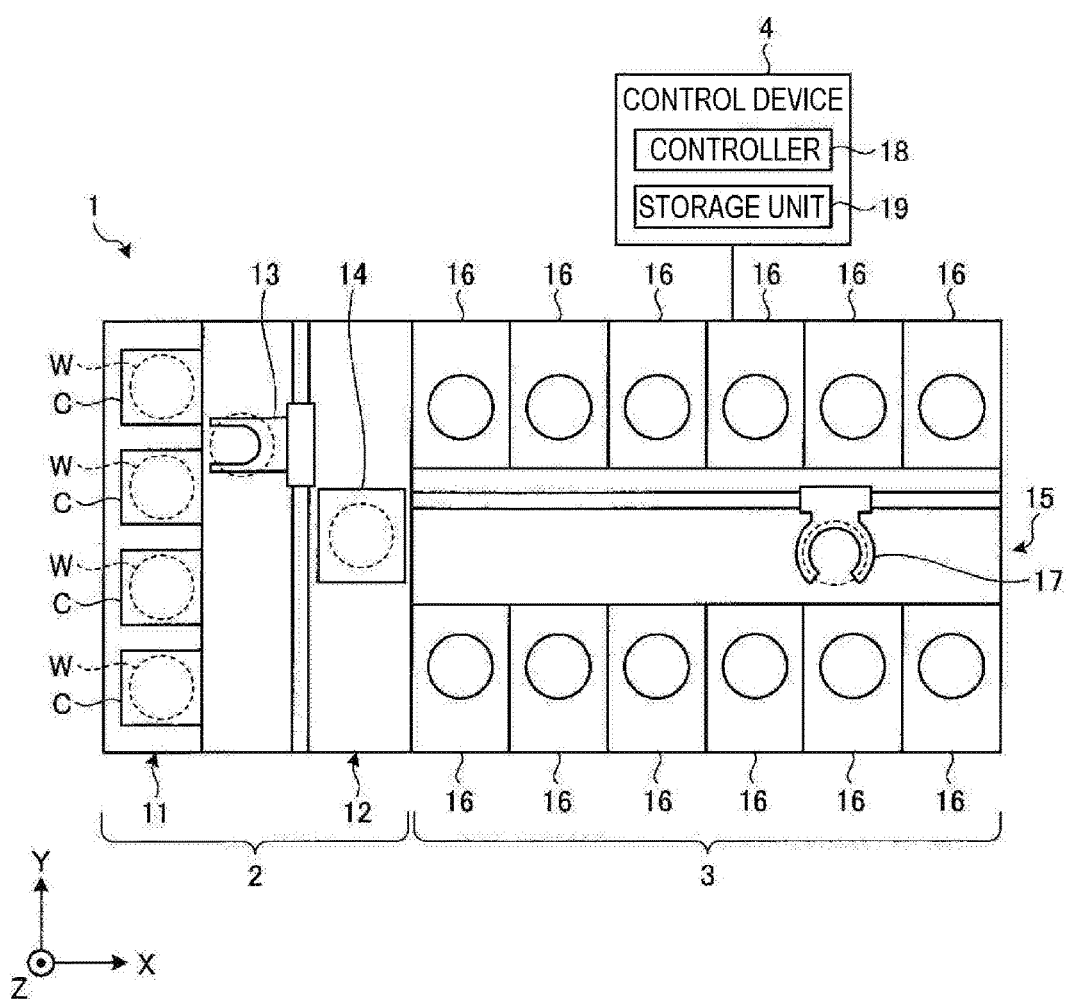
FIG. 1 is a view illustrating an outline of a substrate processing system according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When the exhaust amount of the liquid processing units is increased, a further improvement is required in order to restrict variation in the pressure of each liquid processing unit.

An object of one aspect of the exemplary embodiments is to provide a liquid processing apparatus capable of restricting variation in the pressure of a plurality of liquid processing units.

A liquid processing apparatus according to an exemplary embodiment of the present disclosure includes a plurality of liquid processing units, a plurality of individual exhaust paths, a common exhaust path, a first outside air intake section, a first regulation valve, a second outside air intake section, and a second regulation valve. Each of the plurality of liquid processing units perform a liquid processing on a processing target object by supplying a processing liquid to the processing target object. Each of the plurality of individual exhaust paths is connected to one of the liquid processing units at one end thereof so that an exhaust gas from an inside of the liquid processing unit flows in the individual exhaust paths. The other end of each of the individual exhaust paths is connected to the common exhaust path so that the exhaust gas from the individual exhaust paths is flows in the common exhaust path. The first outside air intake section is formed at the most upstream side, in the common exhaust path in a flow direction of the exhaust gas, from a plurality of connection regions, to which the individual exhaust paths are connected, and introduces outside air into the common exhaust path. The first regulation valve is provided between the first outside air intake section and the connection region, which is located at a most upstream side among the connection regions, and regulates a flow rate of the outside air introduced from the first outside air intake section. The second outside air intake section is formed at a downstream side of the common exhaust path from the connection region, which is located at the most upstream side among the connection regions, and introduces outside air into the common exhaust path. The second regulation valve is provided in the second outside air intake section, and regulates a flow rate of the outside air introduced from the second outside air intake section.

In the above-described liquid processing apparatus, the second outside air intake section is formed at a downstream side of the common exhaust path from the connection region, which is located at a most downstream side in the flow direction of the exhaust gas, among the connection regions.

The above-described liquid processing apparatus further includes: an exhaust amount detection unit configured to detect exhaust amounts of the individual exhaust paths; and a valve controller configured, when a sum of the exhaust amounts of the plurality of individual exhaust paths, which are integrated by the exhaust amount detection unit, is equal to or more than a preset exhaust amount, to open one of the first regulation valve and the second regulation valve in a state where a remaining one is closed, and, when the sum of the exhaust amounts of the individual exhaust paths is less than the preset exhaust amount, to open the first regulation valve and the second regulation valve.

In the above-described liquid processing apparatus, the valve controller is configured, when the sum of the exhaust amounts of the individual exhaust paths, which are detected by the exhaust amount detection unit, is equal to or above the preset exhaust amount, to change an opening degree of the first regulation valve based on the sum of the exhaust amounts of the individual flow paths, and, when the sum of the exhaust amounts of the individual exhaust paths is less than the preset exhaust amount, to change an opening degree of the second regulation valve based on the sum of the exhaust amounts of the individual exhaust paths in a state where the opening degree of the first regulation valve is maintained.

The above-described liquid processing apparatus further includes: an opening/closing mechanism provided in each individual exhaust path to open/close the individual exhaust path; a state detection unit configured to detect a state of the opening/closing mechanism; and a valve controller configured to control opening degrees of the first regulation valve and the second regulation valve based on the state of the opening/closing mechanism detected by the state detection unit.

The above-described liquid processing apparatus further includes: a storage unit configured to store in advance, as opening degree information, the state of the opening/closing mechanism and the opening degrees of the first regulation valve and the second regulation valve corresponding to the state of the opening/closing mechanism, by associating the state and the opening degrees with each other. The valve controller controls the opening degrees of the first regulation valve and the second regulation valve based on the state of the opening/closing mechanism detected by the state detection unit and the opening degree information stored in the storage unit.

In the above-described liquid processing apparatus, the opening degree information includes information in which a positional relationship of the opening/closing mechanism relative to the first regulation valve is associated with the opening degree of the first regulation valve. The valve controller controls the opening degree of the first regulation valve based on the positional relationship of the opening/closing mechanism of which the state is detected by the state detection unit, and the opening degree information stored in the storage unit In the above-described liquid processing apparatus, the second regulation valve is located at a position where a flow direction of the outside air introduced through the second outside air intake section is orthogonal to the flow direction of the exhaust gas at a position of the common exhaust path where the second outside air intake section is formed.

In the above-described liquid processing apparatus, the liquid processing units are configured to supply a plurality of kinds of processing liquids to the processing target object. There is provided a plurality of common exhaust paths to correspond to the kinds of processing liquids, and an outflow point of the exhaust gas flowing through each of the individual flow paths is switched to any one of the common exhaust paths depending on the kinds of processing liquids.

In the above-described liquid processing apparatus, at least one of the first outside air intake section and the second outside air intake section is configured to introduce, as the outside air, atmospheric gas around the liquid processing units.

In the above-described liquid processing apparatus, the valve controller is configured, when the sum of the number of opening/closing mechanisms that are open is equal to or larger than a predetermined number, to change the opening degree of the first regulation valve based on a sum of the number of opening/closing mechanisms that are opened in a state where the second regulation valve is closed, and, when the sum of the number of opening/closing mechanisms that are open is less than the predetermined number, to change the opening degree of the second regulation valve in a state where the opening degree of the first regulation valve is maintained.

With one aspect of the exemplary embodiments, it is possible to suppress pressure fluctuation in a plurality of liquid processing units in a liquid processing apparatus.

First Exemplary Embodiment

1. Configuration of Substrate Processing System

FIG. 1 is a view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable storage medium, and installed from the storage medium to the storage unit 19 of the control device 4. The computer-readable storage medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After processed and placed on the delivery unit 14, the wafer W returns to the carrier C of the carrier placing section 11 by the substrate transfer device.

Meanwhile, the processing station 3 is an exemplary liquid processing apparatus, and the processing unit 16 is an exemplary liquid processing unit. In addition, the number of processing units 16 illustrated in FIG. 1 is given by way of example, and the present disclosure is not limited thereto.

Figure 2:
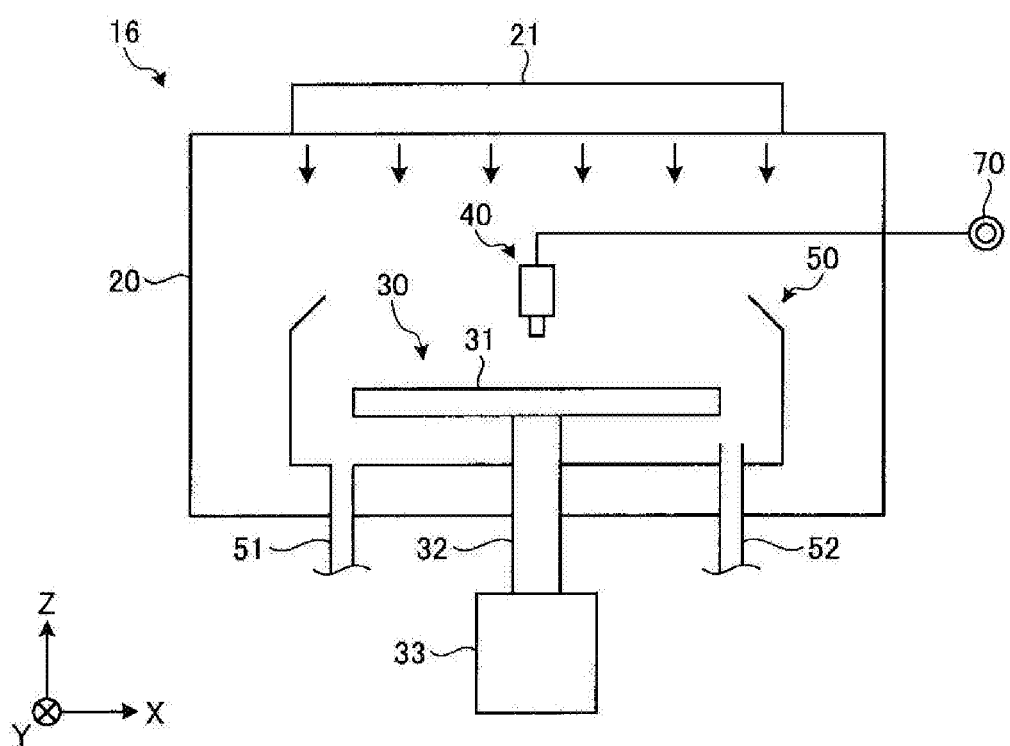
FIG. 2 is a view illustrating an outline of a processing unit.

Next, an outline of the processing unit 16 of the substrate processing system 1 will be described with reference to FIG. 2. FIG. 2 is a view illustrating an outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

2. Detailed Configuration of Processing Unit

Figure 3:
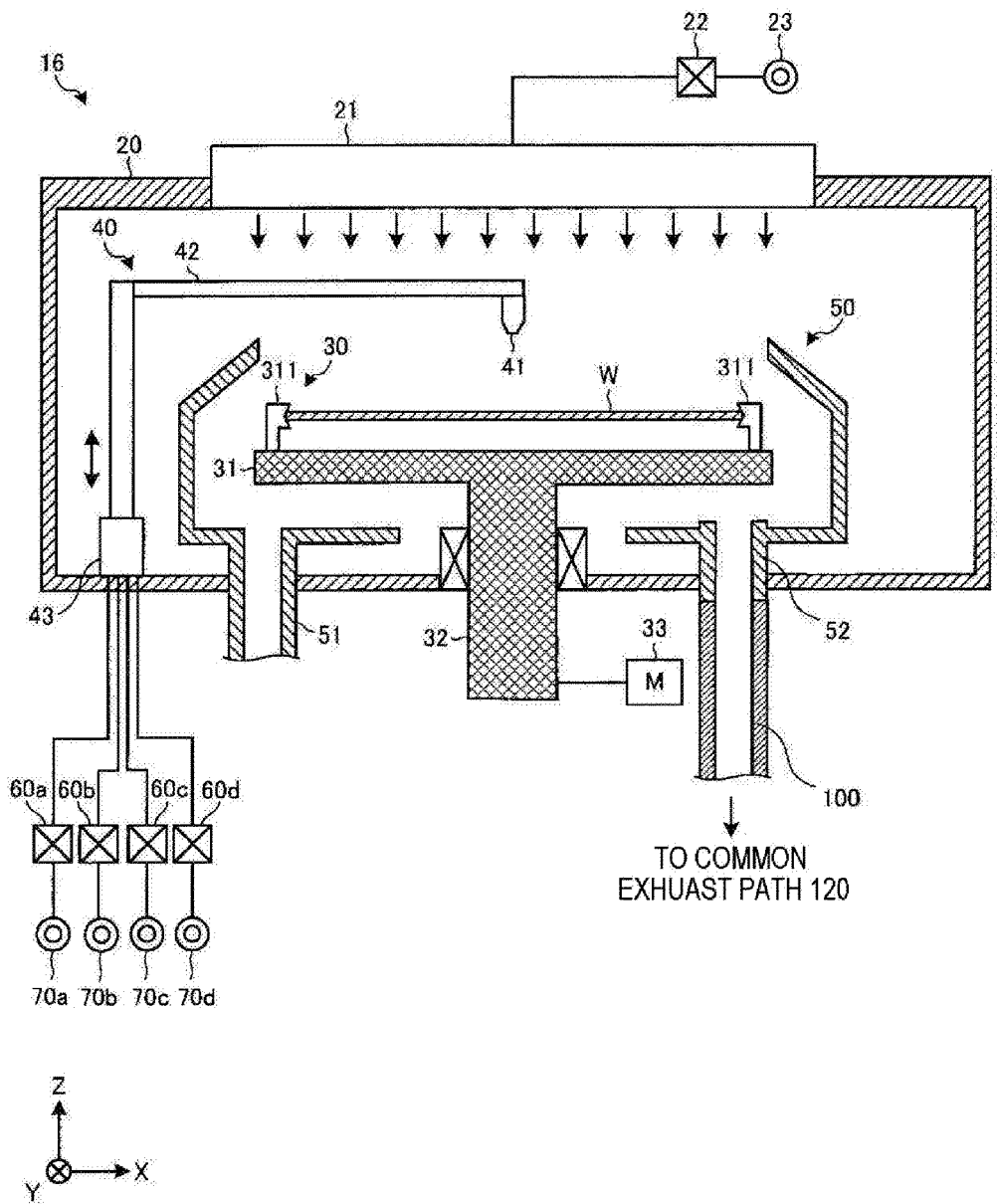
FIG. 3 is a diagram illustrating an exemplary detailed configuration of the processing unit.

Next, a configuration of the processing unit 16 will be described in more detail with reference to FIG. 3. FIG. 3 is a diagram illustrating an exemplary detailed configuration of the processing unit 16.

As illustrated in FIG. 3, an inert gas source 23 is connected to the FFU 21 via a valve 22. The FFU 21 supplies an inert gas such as, for example, $N_2$ gas supplied from the inert gas source 23 to the inside of the chamber 20. Meanwhile, the inert gas supplied from the FFU 21 to the inside of the chamber 20 is discharged to the outside of the chamber 20 from the exhaust port 52 when a valve of a corresponding opening/closing mechanism (described below) is opened. This will be described later.

A holding member 311 configured to hold a wafer W from a side surface thereof is provided on the top surface of the holding unit 31 provided in the substrate holding mechanism 30. The wafer W is horizontally held in a state in which it is slightly spaced apart from the top surface of the holding unit 31 by the holding member 311.

The processing fluid supply unit 40 includes a nozzle 41, an arm 42 configured to horizontally support the nozzle 41, and a pivoting and lifting mechanism 43 configured to pivot and lift the arm 42. One end of a pipe (not illustrated) is connected to the nozzle 41, and the other end of the pipe is diverged into a plurality of pipes. In addition, an alkali-based processing liquid source 70a, an acid-based processing liquid source 70b, an organic-based processing liquid source 70c, and a DIW source 70d are connected to the ends of the diverged pipes, respectively. In addition, valves 60a to 60d are provided between the respective sources 70a to 70d and the nozzle 41, respectively.

The processing fluid supply unit 40 supplies an alkali-based processing liquid, an acid-based processing liquid, an organic-based processing liquid, and a DIW (room-temperature pure water), which are supplied from the respective sources 70a to 70d, from the nozzle 41 to a front surface (processing target surface) of the wafer W, thereby liquid-processing the wafer W. Meanwhile, the wafer W is an exemplary processing target object on which a liquid processing is performed. In addition, it has been described above that the processing fluid supply unit 40 is configured to perform a liquid processing on the front surface of the wafer W, the processing fluid supply unit 40 is not limited thereto, and may be configured to perform the liquid processing on, for example, a rear surface or a peripheral edge of the wafer W.

In the present exemplary embodiment, SCI (a mixture liquid of ammonia, hydrogen peroxide, and water) is used as the alkali-based processing liquid, diluted hydrofluoric acid (DHF) is used as the acid-based processing liquid, and isopropylalcohol (IPA) is used as the organic-based processing liquid. Meanwhile, the acid-based processing liquid, the alkali-based processing liquid, and the organic-based processing liquid are not limited thereto.

3. Exhaust System of Processing Unit

Next, an exhaust processing of the processing unit 16 will be described. One end of an individual exhaust path 100 is connected to the exhaust port 52 of the processing unit 16, and an exhaust gas from the inside of the processing unit 16 flows in the individual exhaust path 100.

Meanwhile, the other end of the individual exhaust path 100 is connected to a common exhaust path 120, and the exhaust gases from the plurality of processing units 16 are discharged all at once through the common exhaust path 120. Exhaust mechanisms 131 to 133 such as, for example, pumps (see, e.g., FIG. 4 to be described below) are connected to the common exhaust path 120, and the pressure in each processing unit 16 is suppressed from being fluctuated at a timing where a liquid processing is performed by maintaining the exhaust flow rate of the common exhaust path 120 constantly. This will be described below.

In this way, the individual exhaust path 100 is connected to the processing unit 16 at one upstream-side end thereof in the flow direction of exhaust gas, and to the common exhaust path 120 at the other downstream-side end thereof. Meanwhile, in the present specification, the expression "upstream" or "downstream" means, for example, "upstream" or "downstream" in the flow direction of the exhaust gas discharged from the processing unit 16.

The processing station 3 according to the present exemplary embodiment is provided with a plurality of processing units 16 so as to increase the number of wafers W to be processed per unit time (throughput).

However, when the plurality of processing units 16 is provided or the exhaust amount of the processing units 16 is increased as described above, a further improvement is required in order to suppress pressure fluctuation of each processing unit 16.

Therefore, the processing station 3 according to the present exemplary embodiment is configured so as to suppress pressure fluctuation of the processing units 16. Hereinafter, this configuration will be described in detail.

Figure 4:
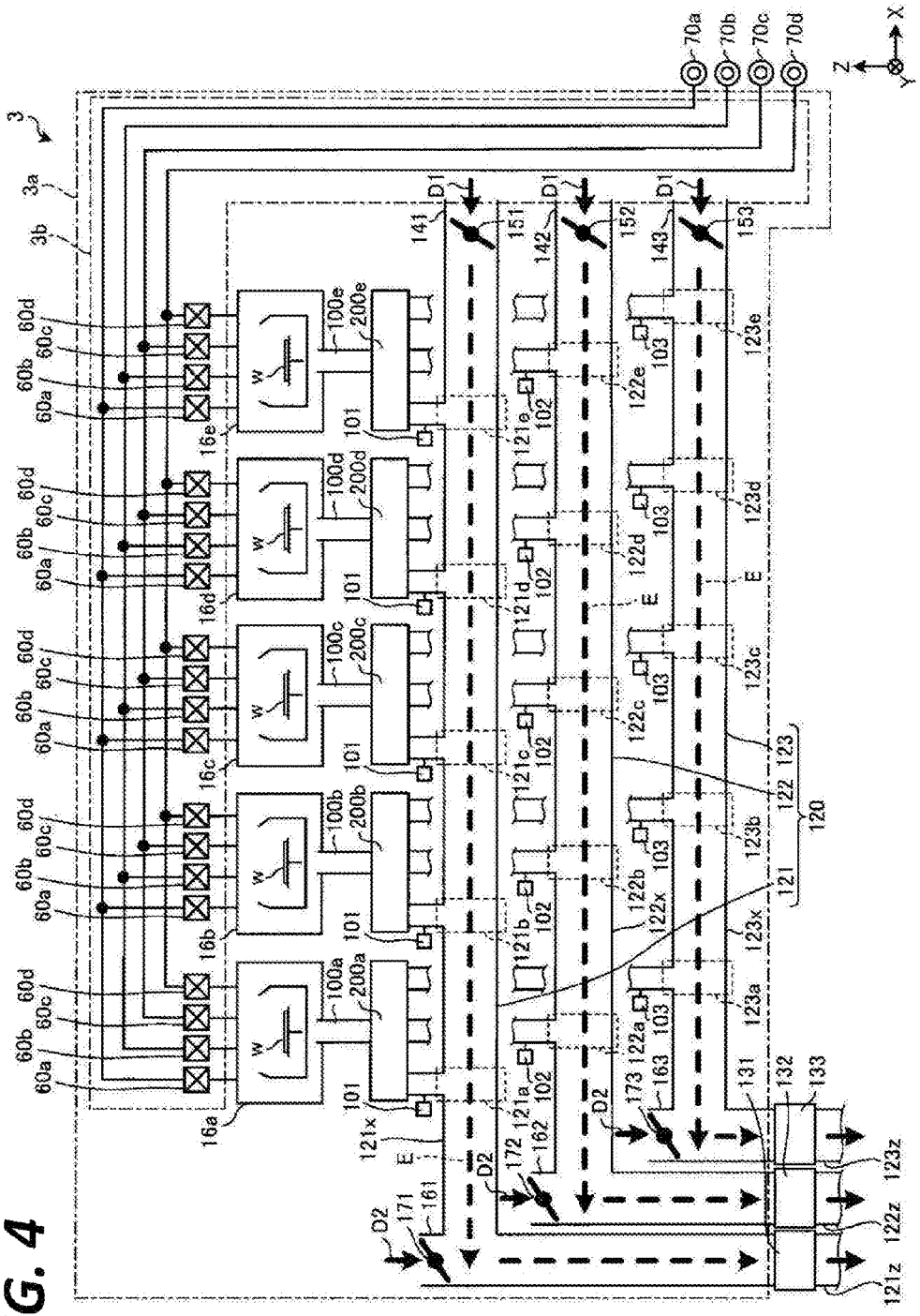
FIG. 4 is a view illustrating an exhaust path in a processing station.

FIG. 4 is a view illustrating an exhaust path in the processing station 3 including the processing units 16. Meanwhile, although FIG. 4 illustrates five (5) processing units 16, the number of processing units is given by way of example and is not limited thereto. In addition, in the following description, the five processing units 16 may be referred to as first to fifth processing units 16a to 16e in some cases, and may also be referred to as "the processing units 16" when the first to fifth processing units 16a to 16e are not distinguished.

As illustrated in FIG. 4, the processing station 3 includes individual exhaust paths 100, a common exhaust path 120, an opening/closing mechanism 200, first outside air intake sections 141 to 143, first regulation valves 151 to 153, second outside air intake sections 161 to 163, and second regulation valves 171 to 173.

The individual exhaust paths 100 are connected to the first to fifth processing units 16a to 16e, respectively. Meanwhile, in FIG. 4, the individual exhaust path 100 connected to a first processing unit 16a is referred to as the "first individual exhaust path 100a," and the individual exhaust path 100 connected to the second processing unit 16b is referred to as a "second individual exhaust path 100b." Likewise, the individual exhaust paths 100 connected to the third to fifth processing units 16c to 16e are referred to as "third to fifth individual exhaust paths 100c to 100e," respectively. In addition, in the following description, the term, "individual exhaust paths 100" may be used when the first to fifth individual exhaust paths 100a to 100e are not distinguished.

The common exhaust path 120 includes dedicated common exhaust paths 121 to 123 so that an exhaust processing is performed for each kind of processing liquid. Specifically, the alkali-based exhaust gas discharged from the processing unit 16 when SCI is used, the acid-based exhaust gas discharged from the processing unit 16 when DHF is used, and the organic-based exhaust gas discharged from the processing unit 16 when IPA is used, may be discharged separately in terms of, for example, preventing contamination of the exhaust paths. Therefore, in the substrate processing system 1 according to the present exemplary embodiment, a plurality of exhaust paths is formed to correspond to a plurality of kinds of processing liquids in such a manner that an exhaust path is provided for each of the alkali-based exhaust gas, the acid-based exhaust gas, and the organic-based exhaust gas.

Specifically, the dedicated common exhaust path 121 is an exhaust path through which the alkali-based exhaust gas flows, the dedicated common exhaust path 122 is an exhaust path through which the acid-based exhaust gas flows, and the dedicated common exhaust path 123 is an exhaust path through which the organic-based exhaust gas flows. Meanwhile, in FIG. 4, the flow directions of the exhaust gases in the dedicated common exhaust paths 121 to 123 are represented by broken line arrows E, respectively.

The opening/closing mechanism 200 is provided in the middle of each of the first to fifth individual exhaust paths 100a to 100e. Meanwhile, in FIG. 4, the opening/closing mechanism 200 provided in the first individual exhaust path 100a is indicated as a "first opening/closing mechanism 200a," and the opening/closing mechanism 200 provided in the second individual exhaust path 100b is indicated as a "second opening/closing mechanism 200b." Likewise, the opening/closing mechanisms 200 provided in the third to fifth individual exhaust paths 100c to 100e are indicated as "third to fifth opening/closing mechanisms 200c to 200e." In addition, in the following description, the opening/closing mechanism 200 may be described when the first to fifth opening/closing mechanisms 200a to 200e are not distinguished.

Each of the first to fifth opening/closing mechanisms 200a to 200e switches an outflow point of exhaust gas flowing through a corresponding one of the first to fifth individual exhaust paths 100a to 100e to any one of the dedicated common exhaust paths 121 to 123 according to the kind of a processing liquid.

Specifically, the individual exhaust path 100 is diverged, in the opening/closing mechanism 200, into three exhaust paths, which are connected to the dedicated common exhaust paths 121 to 123, respectively, and the opening/closing mechanism 200 selectively opens and closes the three exhaust paths, thereby switching the outflow points of exhaust gases. Specifically, although not illustrated, the opening/closing mechanism 200 may include, for example, opening/closing valves on the three exhaust paths, respectively, and may switch the outflow points of exhaust gases by opening and closing the opening/closing valves. Accordingly, the exhaust processing may be appropriately performed according to the processing liquid.

Meanwhile, the first to fifth opening/closing mechanisms 200a to 200e are connected to the control device 4 (see, e.g., FIG. 1), and the opening/closing valves of the first to fifth opening/closing mechanisms 200a to 200e are controlled based on command values from the control device 4, whereby the outflow points of exhaust gases are switched.

In addition, the exhaust mechanisms 131 to 133 are connected to the downstream sides of the dedicated common exhaust paths 121 to 123, respectively. Gas intake devices, such as, for example, pumps may be used as the exhaust mechanisms 131 to 133.

The exhaust mechanisms 131 to 133 are provided, for example, outside the processing station 3, and intake the exhaust gases flowing through the dedicated common exhaust paths 121 to 123, and pressure-feed the exhaust gases to a recovery facility (not illustrated).

In addition, the exhaust amount of each of the exhaust mechanisms 131 to 133 is set to a value that is capable of for suctioning the exhaust gas discharged in the case where all of the first to fifth processing units 16a to 16e have performed an exhaust processing, and the dedicated common exhaust paths 121 to 123 are maintained at a constant set exhaust amount.

Meanwhile, it has been described above that the substrate processing system 1 is configured to include the exhaust mechanisms 131 to 133 in the above description. However, the substrate processing system is not limited thereto. That is, for example, the substrate processing system 1 may be configured such that an exhaust mechanism (not illustrated) is installed at a factory side where the substrate processing system 1 is disposed and the dedicated common exhaust paths 121 to 123 are connected to the exhaust mechanism.

Here, the dedicated common exhaust path 121 will be described among the dedicated common exhaust paths 121 to 123. Meanwhile, the following descriptions of the dedicated common exhaust path 121 may also be applied to the other dedicated common exhaust paths 122 and 123.

The dedicated common exhaust path 121 includes a horizontal portion 121x configured to extend horizontally, and a drop portion 121z formed at the downstream side of the horizontal portion 121x so as to vertically extend downward. Meanwhile, the dedicated common exhaust path 121 is not limited to the above-described shape, and for example, may have any other shape such as for example, a shape in which a horizontally extending pipe is additionally provided at the downstream side of the drop portion 121z.

The horizontal portion 121x of the dedicated common exhaust path 121 is connected to the other end of each of the first to fifth individual exhaust paths 100a to 100e. Specifically, the fifth individual exhaust path 100e, the fourth individual exhaust path 100d, the third individual exhaust path 100c, the second individual exhaust path 100b, and the first individual exhaust path 100a are connected to the horizontal portion 121x in this order from the upstream side.

Meanwhile, in FIG. 4, in the horizontal portion 121x, a connection region 121a connected to the first individual exhaust path 100a is represented by being surrounded by a broken line. Likewise, a connection region 121b connected to the second individual exhaust path 100b, a connection region 121c connected to the third individual exhaust path 100c, a connection region 121d connected to the fourth individual exhaust path 100d, and a connection region 121e connected to the fifth individual exhaust path 100e are represented by being surrounded by broken lines.

The first outside air intake section 141, the first regulation valve 151, the second outside air intake section 161, and the second regulation valve 171 are provided in the dedicated common exhaust path 121.

The first outside air intake section 141 is an opening formed in an end of the dedicated common exhaust path 121 at the opposite side of the exhaust mechanism 131, and intakes outside air into the dedicated common exhaust path 121 through the opening.

Specifically, the first outside air intake section 141 is formed at the most upstream side of the dedicated common exhaust path 121 in the flow direction of exhaust gas, which is disposed at the upstream side from the connection regions 121a to 121e which are connected to the individual exhaust paths 100, respectively. More specifically, the first outside air intake section 141 is formed at the upstream side from the connection region 121e, which is located at the most upstream side among the connection regions 121a to 121e.

The first regulation valve 151 is provided between the first outside air intake section 141 and the connection region 121e, which is located at the most upstream side among the connection regions (including the case of being installed in the first outside air intake section 141), and regulates the flow rate of the outside air introduced from the first outside air intake section 141. In addition, the first regulation valve 151 is located at a position where the flow direction of outside air (the arrow D1) introduced through the first outside air intake section 141 is parallel to the flow direction of exhaust gas (the arrow E) at a position where the first outside air intake section 141 of the dedicated common exhaust path 121 is formed. Thereby, for example, a pressure loss in a flow path, which extends from the first outside air intake section 141 to the dedicated common exhaust path 121 through the first regulation valve 151, may be suppressed.

The second outside air intake section 161 is the most downstream side of the horizontal portion 121x in the dedicated common exhaust path 121, and in addition, is an opening formed vertically above the most upstream side of the drop portion 121z. Outside-air is introduced into the dedicated common exhaust path 121 through the opening.

Specifically, the second outside air intake section 161 is formed at the downstream side from the connection region 121a, which is located at the most downstream side of the dedicated common exhaust path 121 in the flow direction of exhaust gas among the connection regions 121a to 121e.

In this way, in the present exemplary embodiment, the first and second outside air intake sections 141 and 161 are formed in the dedicated common exhaust path 121, so that outside air is introduced from a plurality of regions (specifically, two (2) regions). In this way, pressure fluctuation of the processing units 16 may be suppressed.

That is, for example, when a single outside air intake section is provided, a large quantity of outside-air may be introduced from the single outside air intake section into the dedicated common exhaust path 121 depending on the state of the exhaust gas in the processing units 16. When a large quantity of outside air is introduced from the single outside air intake section, the processing unit 16 close to the outside air intake section is affected thereby such that the pressure is relatively largely lowered and thus pressure fluctuation is caused.

Thus, in the present exemplary embodiment, as the first and second outside air intake sections 141 and 161 are formed in the dedicated common exhaust path 121, outside air introduction places are dispersed to two regions so as to reduce the quantity of outside sir introduced from one outside air intake section. By this, even if a large quantity of outside air is introduced into the dedicated common exhaust path 121, it is possible to reduce the influence on the processing unit 16 may be reduced, and to suppress the pressure fluctuation in the processing units 16.

In addition, because the second outside air intake section 161 is located at the downstream side from the most downstream connection region 121a, the second outside air intake section 161 may be easily formed in the dedicated common exhaust path 121 without changing the arrangement of the plurality of processing units 16 or the opening/closing mechanism 200.

Meanwhile, a position in the dedicated common exhaust path 121 at which the second outside air intake section 161 is formed is not limited to the position illustrated in FIG. 4. That is, the second outside air intake section 161 may be formed in the dedicated common exhaust path 121 at the downstream side from the connection region 121e, which is located at the most upstream side among the connection regions 121a to 121e.

That is, for example, the second outside air intake section 161 may be formed in the dedicated common exhaust path 121 at any other place such as, for example, between the connection region 121a and the connection region 121b or between the connection region 121b and the connection region 121c. Even when the second outside air intake section 161 is formed at any other place described above, it is possible to prevent the pressure fluctuation in the plurality of processing units 16.

The second regulation valve 171 is provided in the second outside air intake section 161, and regulates the flow rate of outside air introduced from the second outside air intake section 161. In addition, the second outside air intake section 161 is located at a position at which the flow direction of outside air (the arrow D2) introduced through the second outside air intake section 161 is orthogonal to the flow direction of exhaust gas (the arrow E) at a position of the dedicated common exhaust path 121 at which the second outside air intake section 161 is formed.

Thus, for example, when the second regulation valve 171 is opened, the introduced outside air may easily join exhaust gas flowing inside the dedicated common exhaust path 121. Meanwhile, since the second regulation valve 171 is located as described above when it is closed, the second regulation is unlikely to interrupt the flow of exhaust gas in the dedicated common exhaust path 121.

Meanwhile, for example, butterfly type exhaust dampers may be used as the first and second regulation valves 151 and 171. In addition, the first and second regulation valves 151 and 171 are connected to the control device 4 (see, e.g., FIG. 1). The opening degrees of the first and second regulation valves 151 and 171 are controlled by the control device 4 such that the flow rate of outside air passing through the first outside air intake section 141 or the second outside air intake section 161 is regulated.

Here, the first outside air intake section 141 and the second outside air intake section 161 will be described in more detail. The first and second outside air intake sections 141 and 161 are configured to introduce, as the outside air, the atmosphere air around the processing unit 16 in the processing station 3 and to discharge the atmospheric gas through the dedicated common exhaust path 121.

Specifically, as illustrated in FIG. 4, the processing station 3 includes cases 3a and 3b. Meanwhile, in FIG. 4, in order to simplify an illustration, both the cases 3a and 3b are schematically represented by alternate long and short dash lines.

The case 3a accommodates main machinery that constitutes the processing station 3, such as, for example, the first to fifth processing units 16a to 16e or the first to fifth opening/closing mechanisms 200a to 200e therein.

The case 3b accommodates, for example, liquid pipes or valves 60a to 60d, which supply a processing liquid from the respective sources 70a to 70d to the first to fifth processing units 16a to 16e. Meanwhile, the case 3b is located inside the case 3a.

The first outside air intake section 141, i.e. the opening is located inside the case 3b. Thus, when the first regulation valve 151 is opened, the atmospheric gas within the case 3b is introduced, as the outside air, from the first outside air intake section 141 into the dedicated common exhaust path 121, and is discharged to the outside of the processing station 3.

In addition, the second outside air intake section 161, i.e. the opening is located inside the case 3a. Thus, when the second regulation valve 171 is opened, the atmospheric gas within the case 3a is introduced, as the outside air, from the second outside air intake section 161 into the dedicated common exhaust path 121, and is discharged to the outside of the processing station 3.

In this way, by locating the first and second outside air intake sections 141 and 161 inside the cases 3a and 3b, the dedicated common exhaust path 121 may function as an exhaust path inside the processing unit 16 as well as an exhaust path around the processing unit 161 including, for example, a liquid pipe or the periphery of the valves 60a to 60d.

Meanwhile, it has been described above that the atmospheric air around the processing unit 16 is introduced from both the first and second outside air intake sections 141 and 161. However, without being limited thereto, the first and second outside air intake sections 141 and 161 may be configured such that the atmospheric gas may be introduced from any one of the first and second outside air intake sections 141 and 161.

The other dedicated common exhaust paths 122 and 123 have the same configuration as the dedicated common exhaust path 121. That is, the dedicated common exhaust path 122 includes a horizontal portion 122x and a drop portion 122z. The first to fifth individual exhaust paths 100a to 100e are connected to the horizontal portion 122x through connection regions 122a to 122e, respectively.

In the dedicated common exhaust path 122, a first outside air intake section 142 is formed at the upstream side from the connection region 122e, which is located at the most upstream side, and a first regulation valve 152 is provided between the first outside air intake section 142 and the connection region 122e, which is located at the most upstream side, among the connection regions. In addition, in the dedicated common exhaust path 122, a second outside air intake section 162 is formed at the downstream side from the connection region 122a, which is located at the most downstream side, and a second regulation valve 172 is provided in the second outside air intake section 162.

The dedicated common exhaust path 123 includes a horizontal portion 123x and a drop portion 123z. The first to fifth individual exhaust paths 100a to 100e are connected to horizontal portion 123x through connection regions 123a to 123e, respectively.

In the dedicated common exhaust path 123, a first outside air intake section 143 is formed at the upstream side from the connection region 123e, which is located at the most upstream side, and a first regulation valve 153 is provided between the first outside air intake section 143 and the connection region 123e, which is located at the most upstream side, among the connection regions. In addition, in the dedicated common exhaust path 123, a second outside air intake section 163 is formed at the downstream side from the connection region 123a, which is located at the most downstream side, and a second regulation valve 173 is provided in the second outside air intake section 163.

The processing station 3 further includes exhaust pressure detection units 101 to 103. The exhaust pressure detection unit 101 is provided in a flow path of each of the first to fifth individual exhaust paths 100a to 100e, which are connected to the dedicated common exhaust path 121 at the downstream side from the opening/closing mechanism 200, and outputs a signal indicating the pressure of the exhaust gas discharged to the dedicated common exhaust path 121. That is, the exhaust pressure detection unit 101 detects the pressure of alkali-based exhaust gas discharged from the first to fifth processing units 16a to 16e.

The exhaust pressure detection unit 102 is installed in a flow path of each of the first to fifth individual exhaust paths 100a to 100e, which are connected to the dedicated common exhaust path 122 at the downstream side from the opening/closing mechanism 200, and outputs a signal indicating the pressure of exhaust gas discharged to the dedicated common exhaust path 122. That is, the exhaust pressure detection unit 102 detects the pressure of acid-based exhaust gas discharged from the first to fifth processing units 16a to 16e.

The exhaust pressure detection unit 103 is installed in a flow path of each of the first to fifth individual exhaust paths 100a to 100e, which are connected to the dedicated common exhaust path 123 at the downstream side from the opening/closing mechanism 200, and outputs a signal indicating the pressure of exhaust gas discharged to the dedicated common exhaust path 123. That is, the exhaust pressure detection unit 103 detects the pressure of organic-based exhaust gas discharged from the first to fifth processing units 16a to 16e.

The signals output from the exhaust pressure detection units 101 to 103 are input to the control device 4 (see, e.g., FIG. 1). Meanwhile, for example, pressure sensors may be used as the exhaust pressure detection units 101 to 103, without being limited thereto.

In the processing station 3 configured as described above, for example, the first regulation valves 151, 152 and 153, the second regulation valves 171, 172 and 173, and the first to fifth opening/closing mechanisms 200a to 200e are controlled by the control device 4.

4. Detailed Configuration of Control Device

Figure 5:
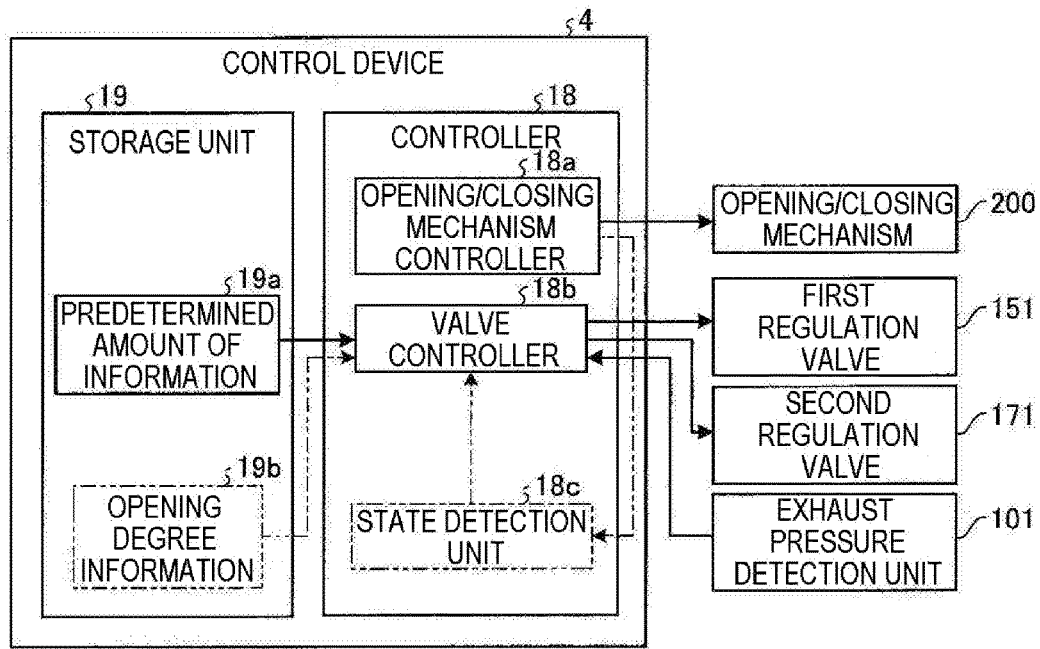
FIG. 5 is a block diagram of a control device.

Next, the control device 4 will be described in more detail with reference to FIG. 5. FIG. 5 is a block diagram of the control device 4. Meanwhile, in the following description of FIG. 5, the control of the first regulation valve 151 or the second regulation valve 171 will be described by way of example. Meanwhile, because the following description of the first regulation valve 151 or the second regulation valve 171 may also be applied to the control of the first regulation valves 152 and 153 or the second regulation valves 172 and 173, the illustration in the block diagram and detailed descriptions thereof will be omitted.

In addition, FIG. 5 illustrates constituent elements required to describe the present exemplary embodiment with functional blocks, and the descriptions of general constituent elements are omitted. In other words, the respective constituent elements illustrated in FIG. 5 correspond to functional concepts, and are not necessary to be physically configured as illustrated. For example, the detailed forms of dispersion/integration of the respective functional blocks are not limited to the illustration, and some or all of the functional blocks may be functionally or physically dispersed or integrated in an arbitrary unit according to, for example, various loads or use situations.

In addition, all or some arbitrary ones among respective processing functions performed in the respective functional blocks may be realized by a processor such as, for example, a central processing unit (CPU) and programs, which are interpreted and executed by the processor, or may be realized as hardware by wired logic.

First, as described above, the control device 4 includes a controller 18 and a storage unit 19 (see, e.g., FIG. 1). The controller 18 is, for example, a CPU. The controller 18 functions as, for example, respective functional blocks 18a and 18b illustrated in FIG. 5 by reading and executing programs (not illustrated) stored in the storage unit 19. Next, the respective functional blocks 18a and 18b will be described.

As illustrated in FIG. 5, for example, the controller 18 includes an opening/closing mechanism controller 18a and a valve controller 18b. In addition, the storage unit 19 stores a predetermined amount of information 19a.

The opening/closing mechanism controller 18a outputs a command value, which depends on the kind of processing liquid used in the processing unit 16, to the opening/closing mechanism 200 so as to control the opening/closing valve of the opening/closing mechanism 200. Specifically, for example, in the first processing unit 16a, when SC1, which is an alkali-based processing liquid, is supplied to the wafer W, the opening/closing mechanism controller 18a controls the first opening/closing mechanism 200a so that the first individual exhaust path 100a communicates with the dedicated common exhaust path 121. By this, the alkali-based exhaust gas within the first processing unit 16a may be discharged to the dedicated common exhaust path 121.

In addition, for example, in the first processing unit 16a, when DHF, which is an acid-based processing liquid, is supplied to the wafer W, the opening/closing mechanism controller 18a controls the first opening/closing mechanism 200a so that the first individual exhaust path 100a communicates with the dedicated common exhaust path 122. By this, the acid-based exhaust gas within the first processing unit 16a may be discharged to the dedicated common exhaust path 122.

Likewise, in the first processing unit 16a, when IPA, which is an organic-based processing liquid, is supplied to the wafer W, the opening/closing mechanism controller 18a controls the first opening/closing mechanism 200a so that the first individual exhaust path 100a communicates with the dedicated common exhaust path 123. By this, the organic-based exhaust gas within the first processing unit 16a may be discharged to the dedicated common exhaust path 123.

A signal, which indicates the exhaust pressure of the individual exhaust path 100 detected by the exhaust pressure detection unit 101, is input to the valve controller 18b. The valve controller 18b calculates an exhaust amount based on the exhaust pressure of the individual exhaust path 100 by using a relational expression between a preset exhaust pressure and an exhaust amount of the individual exhaust path 100. Then, the valve controller 18b controls the first regulation valve 151 and the second regulation valve 171 based on the exhaust amount of the individual exhaust path 100. As such, the exhaust pressure detection unit 101 may be an exemplary exhaust amount detection unit because the exhaust amount may be calculated based on the output of the exhaust pressure detection unit 101.

Specifically, because the exhaust pressure detection unit 101 is installed in each of the first to fifth individual exhaust paths 100a to 100e as described above, signals from the five exhaust pressure detection units 101 are input to the valve controller 18b.

The valve controller 18b includes an exhaust amount detection unit configured to add the exhaust amounts acquired from the exhaust pressures detected by the five exhaust pressure detection units 101, and calculates the total exhaust amount, which is the sum of the exhaust amounts of the first to fifth individual exhaust paths 100a to 100e. Meanwhile, the total exhaust amount of the first to fifth individual exhaust paths 100a to 100e corresponds to the total exhaust amount of the first to fifth processing units 16a to 16e.

The valve controller 18b compares the calculated total exhaust amount of the individual exhaust path 100 with a predetermined amount A, which is a preset exhaust amount, and controls the first and second regulation valves 151 and 171 based on the result of the comparison. The control of the first and second regulation valves 151 and 171 will be described with reference to FIG. 6 and FIGS. 7A to 7C.

Figure 6:
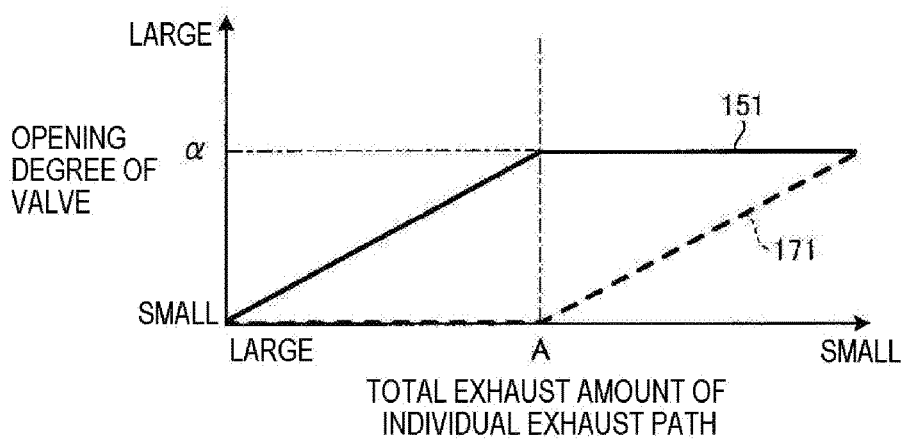
FIG. 6 is a view illustrating an exemplary relationship between the total exhaust amount of an individual exhaust path and the opening degrees of first and second regulation valves.
Figure 7A:
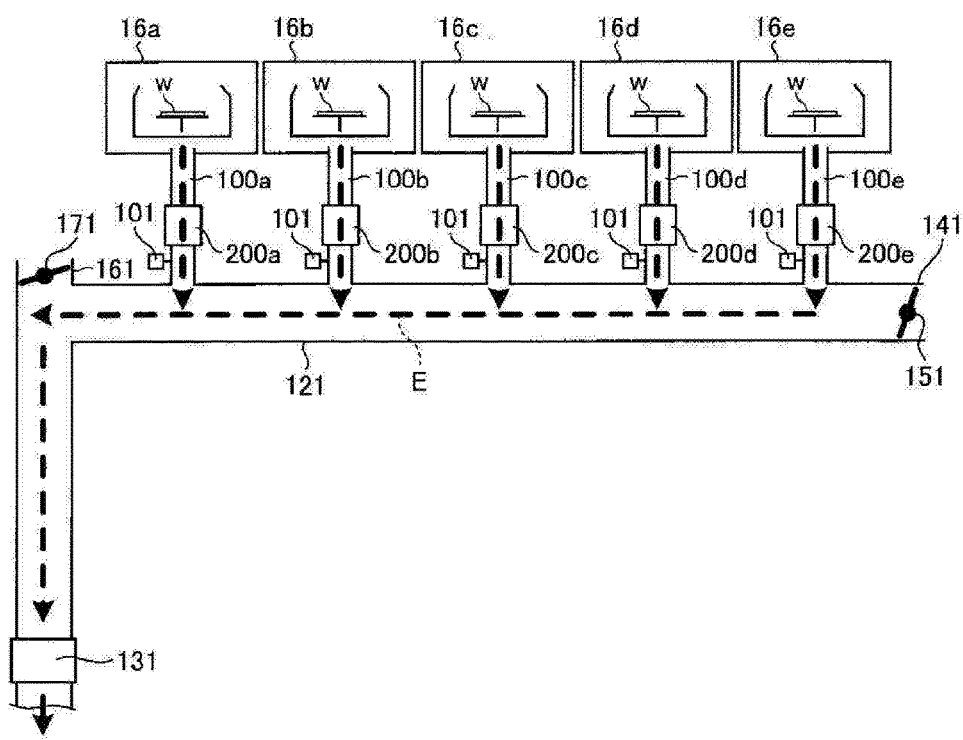
FIG. 7A is a view for explaining an operation of the first and second regulation valves (Part 1).
Figure 7B:
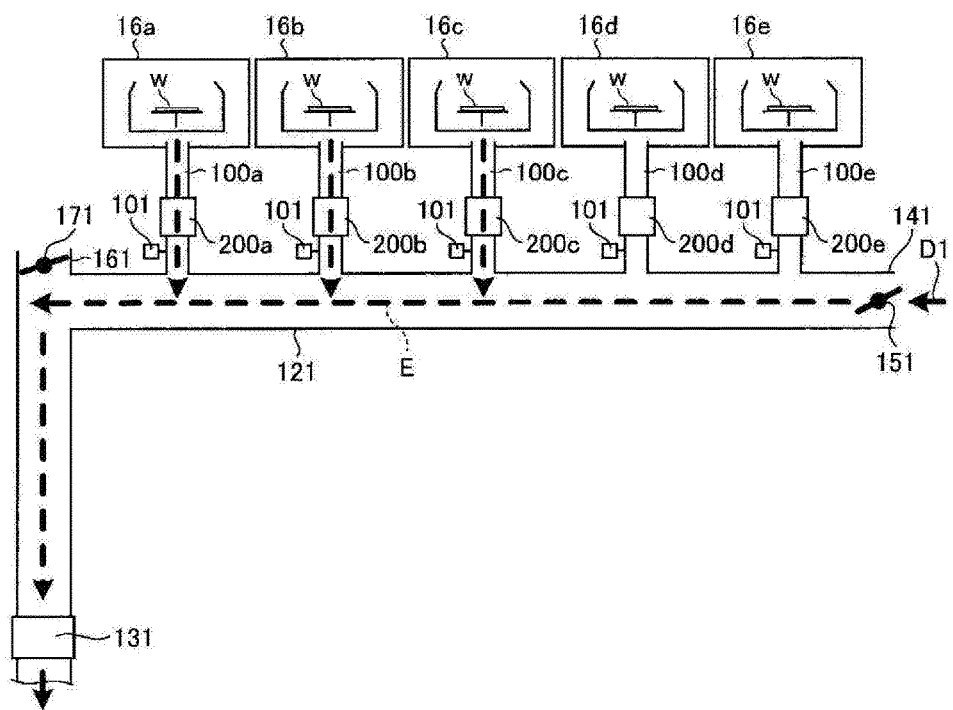
FIG. 7B is a view for explaining an operation of the first and second regulation valves (Part 2).
Figure 7C:
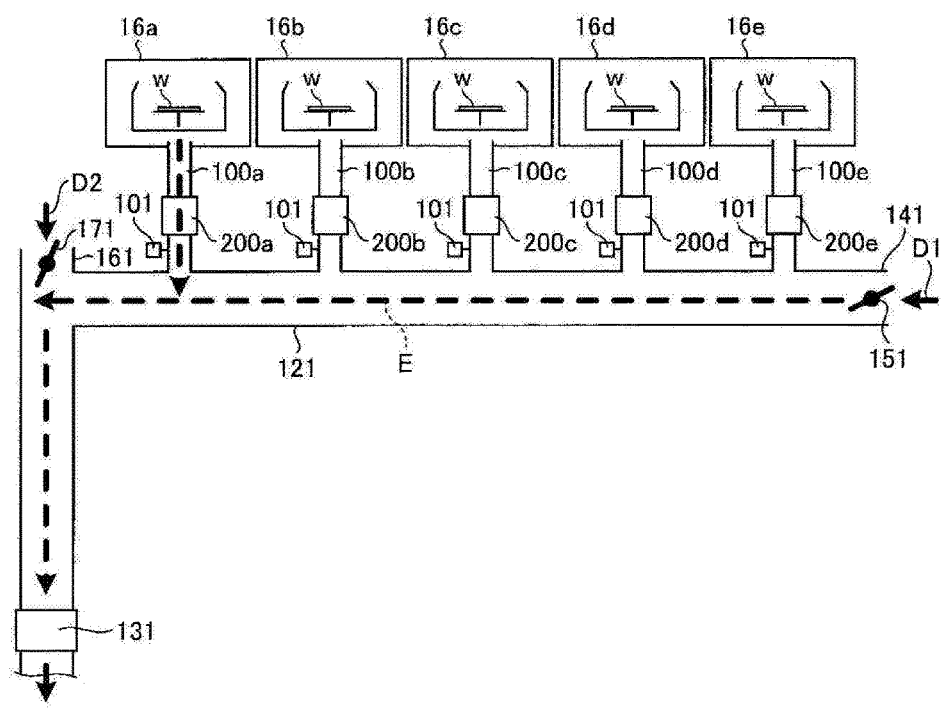
FIG. 7C is a view for explaining an operation of the first and second regulation valves (Part 3).

FIG. 6 is a view illustrating an exemplary relationship between the total exhaust amount of the individual exhaust path 100 and the opening degrees of the first and second regulation valves 151 and 171. Meanwhile, in FIG. 6, the opening degree of the first regulation valve 151 is represented by a solid line while the opening degree of the second regulation valve 171 is represented by a broken line. In addition, FIGS. 7A to 7C are views for explaining an operation of the first and second regulation valves 151 and 171.

As illustrated in FIG. 6, the valve controller 18b closes both the first and second regulation valves 151 and 171 when the total exhaust amount of the individual exhaust path 100 is at or near the maximum value. That is, as illustrated in FIG. 7A, when the total exhaust amount of the individual exhaust path 100 is at or near the maximum value, it may be estimated that an exhaust processing is being performed in all the first to fifth processing units 16a to 16e.

In addition, the exhaust amount of the exhaust mechanism 131, as described above, is set to a value that is capable of suctioning an exhaust gas discharged in the case where an exhaust processing has been performed in all of the first to fifth processing units 16a to 16e. Therefore, in FIG. 7A, because the supply flow rate from the FFU 21 (see, e.g., FIG. 3) of the first to fifth processing units 16a to 16e and the exhaust amount of the exhaust mechanism 131 are balanced, it is not necessary to introduce outside air from, for example, the first outside air intake section 141. Accordingly, the valve controller 18b closes both the first and second regulation valves 151 and 171 when the total exhaust amount of the individual exhaust path 100 is at or near the maximum value.

Referring to FIG. 6 again, the valve controller 18b opens the first regulation valve 151 when the total exhaust amount of the individual exhaust path 100 is less than the maximum value, but equal to or more than the predetermined flow rate A. Specifically, the valve controller 18b performs a control such that the first regulation valve 151 is slowly opened as the total exhaust amount is reduced from the maximum value, and a preset and predetermined opening degree α is achieved when the total exhaust amount becomes the predetermined amount A. Meanwhile, the second regulation valve 171 remains closed.

That is, as illustrated in FIG. 7B, when the total exhaust amount of the individual exhaust path 100 is less than the maximum value, but equal to or more than the predetermined amount A, it may be estimated that no exhaust processing is being performed in some of the first to fifth processing units 16a to 16e.

Meanwhile, FIG. 7B illustrates a state in which no exhaust processing is being performed in the fourth and fifth processing units 16d and 16e. However, this is merely given by way of example and the present disclosure is not limited thereto. In addition, here, the expression "no exhaust processing is being performed" means that exhaust processing to the dedicated common exhaust path 121 is not being performed, and does not mean that exhaust processing to the other dedicated common exhaust paths 122 and 123 is also not being performed.

When no exhaust processing is being performed in the fourth and fifth processing units 16d and 16e, the exhaust amount of the exhaust mechanism 131 is constant so that the exhaust amount of the first to third processing units 16a to 16c may be increased, thereby causing pressure fluctuation.

Therefore, the valve controller 18b is configured to introduce outside air from the first outside air intake section 141 to the dedicated common exhaust path 121 (the arrow D1) by opening the first regulation valve 151. By this, the exhaust amount of the first to third processing units 16a to 16c is hardly increased, which may suppress pressure fluctuation.

Meanwhile, the predetermined amount A is the lower limit value of the total exhaust amount of the individual exhaust path 100, which may suppress pressure fluctuation using the flow rate of outside air introduced from the first outside air intake section 141. The predetermined amount A is preset, for example, through tests. The set predetermined amount A is stored, as the predetermined amount information 19a, in the storage unit 19. In addition, the predetermined opening degree α may be set to an arbitrary value.

Meanwhile, it has been described above that the valve controller 18b opens the first regulation valve 151 and closes the second regulation valve 171. However, the valve controller 18b is not limited thereto, and may open the second regulation valve 171 and close the first regulation valve 151.

Referring to FIG. 6 again, the valve controller 18b opens the first regulation valve 151 and the second regulation valve 171 when the total exhaust amount of the individual exhaust path 100 is less than the predetermined amount A. Specifically, the valve controller 18b additionally opens the second regulation valve 171, in addition to the first regulation valve 151 that has been open, when the total exhaust amount is less than the predetermined amount A. Specifically, the valve controller 18b performs a control such that the second regulation valve 171 is slowly opened as the total exhaust amount is reduced from the predetermined amount A, thereby the predetermined opening degree α is achieved when the total flow rate is at or near the minimum value. Meanwhile, the first regulation valve 151 remains at the predetermined opening degree α.

That is, as illustrated in FIG. 7C, when the total exhaust amount of the individual exhaust path 100 is less than the predetermined amount A, it may be estimated that the number of processing units 16, in which no exhaust processing is being performed among the first to fifth processing units 16a to 16e is increased, compared to the state illustrated in FIG. 7B. Meanwhile, although FIG. 7C illustrates a state in which no exhaust processing is being performed in the second to fifth processing units 16b to 16e, this is merely given by way of example, and the present disclosure is not limited thereto.

When no exhaust processing is being performed in the second to fifth processing units 16b to 16e, the exhaust amount of the exhaust mechanism 131 is constant the exhaust amount of the first processing unit 16a may be increased relatively largely, thereby causing pressure fluctuation.

Therefore, the valve controller 18b is configured to introduce outside air from the second outside air intake section 161 to the dedicated common exhaust path 121 (the arrow D2) by opening the second regulation valve 171, in addition to opening the first regulation valve 151.

That is, when the total exhaust amount, which is the sum of the exhaust amounts of the individual exhaust paths 100 added by the exhaust amount detection unit, is equal to or more than a preset exhaust amount, the valve controller 18b changes the opening degree of the first regulation valve 151 based on the total exhaust amount of the individual exhaust path 100 in a state in which the second regulation valve 171 is closed. When the total exhaust amount, which is the sum of the exhaust amounts of the individual exhaust paths 100, is less than the preset exhaust amount, the valve controller 18b opens the second regulation valve 171 while maintaining the opening degree of the first regulation valve 151, and also changes the opening degree of the second regulation valve 171 based on the sum of the exhaust amounts of the individual flow paths 100.

By introducing outside air from two regions as described above, the exhaust amount of the first processing unit 16a is hardly increased, which may suppress pressure fluctuation.

5. Detailed Operation of Substrate Processing System

Next, an exhaust processing executed in the substrate processing system 1 will be described. Here, prior to describing the exhaust processing, a series of substrate processing executed in the substrate processing system 1 according to the present exemplary embodiment will be described.

Figure 8:
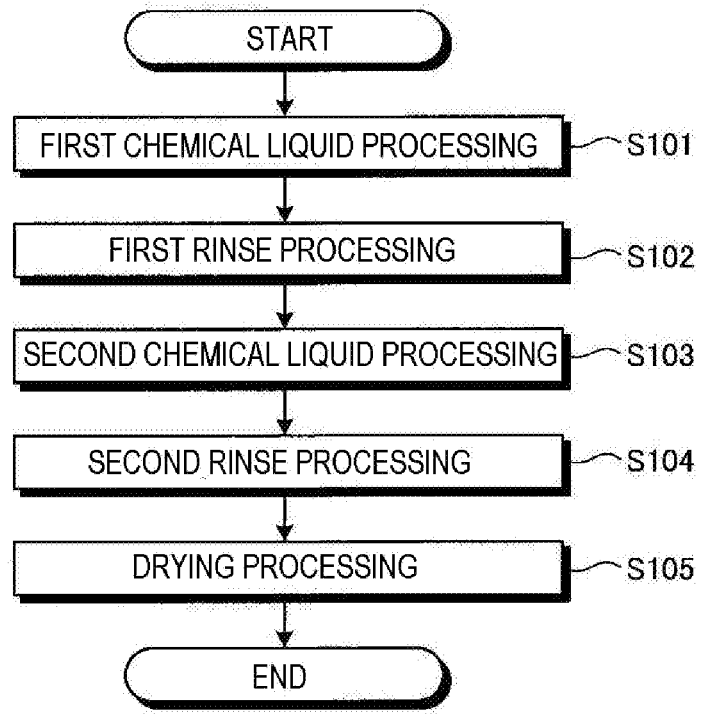
FIG. 8 is a flowchart illustrating an exemplary processing sequence of a substrate processing executed in the substrate processing system.

FIG. 8 is a flowchart illustrating one example of the processing sequence of a substrate processing executed in the substrate processing system 1.

As illustrated in FIG. 8, the controller 18 first performs a first chemical liquid processing (Step S101). In the first chemical liquid processing, first, the driving unit 33 rotates the holding unit 31, thereby rotating the wafer W held on the holding unit 31 at a predetermined rotating speed. Then, the controller 18 causes the nozzle 41 of the processing fluid supply unit 40 to be located above the center of the wafer W. Thereafter, the controller 18 causes the valve 60a to be opened for a predetermined time period so as to supply SC1, supplied from the alkali-based processing liquid source 70a, to the processing target surface of the wafer W through the nozzle 41.

Subsequently, the controller 18 performs a first rinse processing (Step S102). In the first rinse processing, the controller 18 causes the valve 60d to be opened for a predetermined time period so as to supply DIW, supplied from the DIW source 70d, to the processing target surface of the wafer W through the nozzle 41.

Subsequently, the controller 18 performs a second chemical liquid processing (Step S103). In the second chemical liquid processing, the controller 18 causes the valve 60b to be opened for a predetermined time period so as to supply DHF, supplied from the acid-based processing liquid source 70b, to the processing target surface of the wafer W through the nozzle 41.

Subsequently, the controller 18 performs a second rinse processing (Step S104). In the second rinse processing, the controller 18 causes the valve 60d to be opened for a predetermined time period so as to supply DIW, supplied from the DIW source 70d, to the processing target surface of the wafer W through the nozzle 41.

Subsequently, the controller 18 performs a drying processing (Step S105). In the drying processing, the controller 18 causes the valve 60c to be opened for a predetermined time period so as to supply IPA, supplied from the organic-based processing liquid source 70c, to the processing target surface of the wafer W through the nozzle 41. Thereafter, the controller 18 increases the rotating speed of the wafer w so as to dispel IPA on the wafer W, thereby drying the wafer W.

Figure 9:
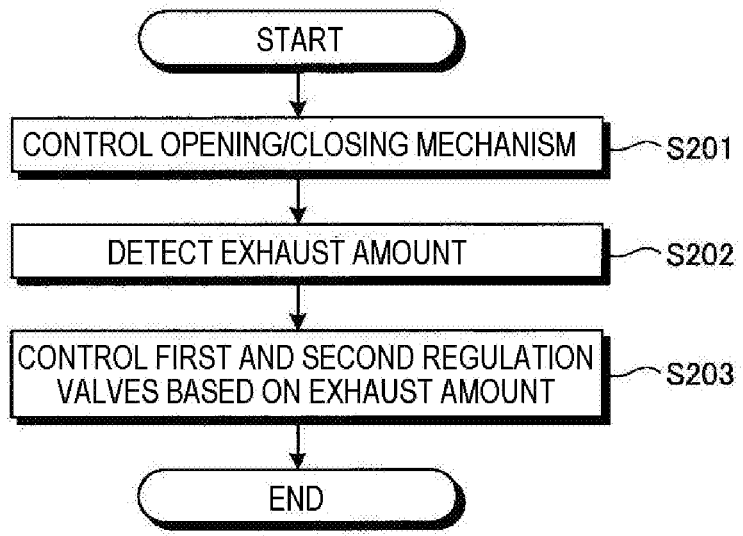
FIG. 9 is a flowchart illustrating an exemplary processing sequence of an exhaust processing executed in the substrate processing system.

Next, an exhaust processing executed in the substrate processing system 1 will be described with reference to FIG. 9. FIG. 9 is a flowchart illustrating an exemplary processing sequence of an exhaust processing executed in the substrate processing system 1. Here, the exhaust processing is performed along with the substrate processing.

As illustrated in FIG. 9, the opening/closing mechanism controller 18a of the controller 18 controls the opening/closing mechanism 200 based on the kind of a processing liquid used in the processing unit 16 (Step S201). By this, the atmospheric gas within the processing unit 16 is appropriately discharged to the dedicated common exhaust paths 121 to 123 based on the processing liquid.

Subsequently, the valve controller 18b detects the exhaust amount of the individual flow path 100 based on the exhaust pressure detected by the exhaust pressure detection unit 101 (Step S202). In succession, the valve controller 18b controls the first regulation valve 151 and the second regulation valve 171 based on the detected exhaust amount (Step S203). By this, outside air from the first outside air intake section 141 or the second outside air intake section 161 is appropriately introduced into the dedicated common exhaust path 121, thereby suppressing pressure fluctuation in the processing unit 16.

Second Exemplary Embodiment

6. Configuration of Substrate Processing System According to Second Exemplary Embodiment Subsequently, the substrate processing system 1 according to the second exemplary embodiment will be described. Meanwhile, in the following description, the same parts as those described above are designated by the same reference numerals as the parts described above, and redundant descriptions will be omitted. In addition, in the description of the second exemplary embodiment, the control of the first and second regulation valves 151 and 171 will be described by way of example, as in the description of the first exemplary embodiment.

The control device 4 of the substrate processing system 1 according to the second exemplary embodiment is configured to detect the state of the opening/closing mechanism 200 and to control the first and second regulation valves 151 and 171 based on the detected state of the opening/closing mechanism 200 in the exhaust processing.

More specifically, the controller 18 further includes a state detection unit 18c configured to detect the state of the opening/closing mechanism 200 as represented by an imaginary line in FIG. 5. In addition, the storage unit 19 stores opening degree information 19b, as indicated by imaginary lines in FIG. 5. Meanwhile, it is assumed that the storage unit 19 according to the second exemplary embodiment does not store a predetermined amount of information 19a.

A command value, which is output from the opening/closing mechanism controller 18a to the opening/closing mechanism 200, is input to the state detection unit 18c. The command value is a control signal indicating the opening degree for the opening/closing mechanism 200.

The state detection unit 18c detects the state of the opening/closing mechanism 200 based on the input command value. Here, the state of the opening/closing mechanism 200 is, for example, the number of opening/closing mechanisms 200, of which the opening/closing valve is opened, among the first to fifth opening/closing mechanisms 200a to 200e.

Meanwhile, the state of the opening/closing mechanism 200 detected by the state detection unit 18c is not limited thereto, and for example, may be the opening degree of the opening/closing valve of the opening/closing mechanism 200. In addition, it has been described above that the state detection unit 18c detects the state of the opening/closing mechanism 200 using the command value of the opening/closing mechanism controller 18a. However, the present disclosure is not limited thereto. That is, for example, an encoder may be attached to the opening/closing valve of the opening/closing mechanism 200, and the state of the opening/closing mechanism 200 may be detected based on a signal indicating the valve opening degree output from the encoder.

The state detection unit 18c outputs a signal indicating the state of the opening/closing mechanism 200, and specifically, a signal indicating the number of opening/closing mechanisms 200, of which the opening/closing valve is open, to the valve controller 18b. Meanwhile, the number of opening/closing mechanisms 200, of which the opening/closing valves are opened, may also be referred to as the number of processing units 16 in which the exhaust processing is being performed and which are in communication with the dedicated common exhaust path 121, among the first to fifth processing units 16a to 16e.

Figures 10, 11:
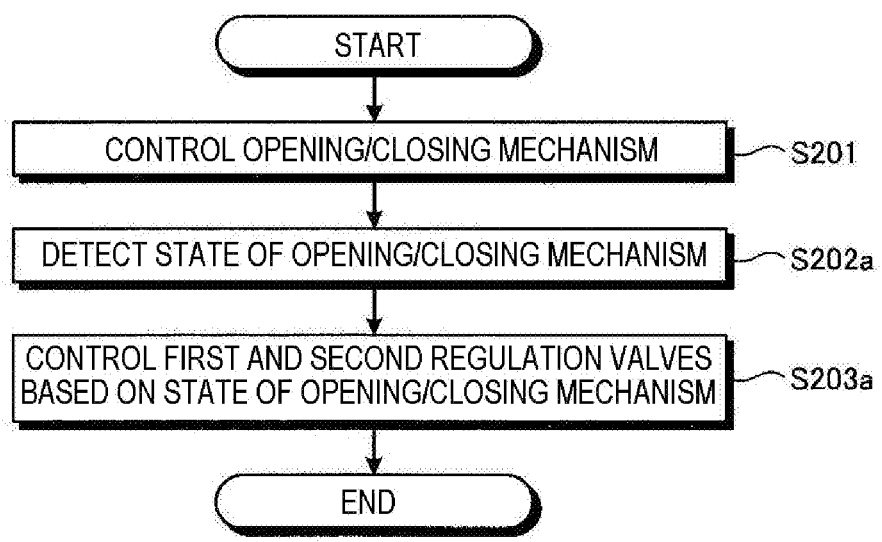
FIG. 10 is a view illustrating exemplary opening degree information.
FIG. 11 is a flowchart illustrating an exemplary processing sequence of an exhaust processing executed in the substrate processing system according to a second exemplary embodiment.

The valve controller 18b controls the first and second regulation valves 151 and 171 based on the state of the opening/closing mechanism 200 detected by the state detection unit 18c, in other words, the number of communicating processing units 16 and the opening degree information 19b. FIG. 10 is a view illustrating exemplary opening degree information 19b.

As illustrated in FIG. 10, with regard to the number of communicating processing units 16, the opening degrees of the first and second regulation valves 151 and 171, which may suppress pressure fluctuation in the communicating processing unit 16s, are previously acquired via tests, and the acquired opening degrees are stored, as the opening degree information 19b, in the storage unit 19. Meanwhile, in FIG. 10, the second predetermined opening degree $\alpha 0$ is set to a value that is larger than 0 (zero) and is less than the predetermined opening degree $\alpha$.

FIG. 10 is described in detail. For example, when the number of communicating processing units 16 is five (5), this means that an exhaust processing is being performed in all the first to fifth processing units 16a to 16e (see, e.g., FIG. 7A). Accordingly, as described above in the first exemplary embodiment, it is not necessary to introduce outside air from, for example, the first outside air intake section 141, and thus, the opening degrees of the first and second regulation valves 151 and 171 are set to zero.

In addition, as the number of communicating processing units 16 is reduced to four (4) or three (3), the opening degree of the first regulation valve 151 is set to be increased stepwise to the second predetermined opening degree $\alpha 0$ and to the predetermined opening degree $\alpha$. Meanwhile, the opening degree of the second regulation valve 171 remains 0 (zero). By this, as described in the first exemplary embodiment, outside air from the first outside air intake section 141 is introduced into the dedicated common exhaust path 121, and thus the exhaust amount of the communicating processing unit 16 is hardly increased, which may suppress pressure fluctuation (see, e.g., FIG. 7B).

In addition, when the number of communicating processing units 16 is reduced to 2 or 1, the opening degree of the second regulation valve 171 is set so as to increase stepwise to the second predetermined opening degree $\alpha 0$ and to the predetermined opening degree $\alpha$ in a state in which the opening degree of the first processing valve 151 remains at the predetermined opening degree $\alpha$. Meanwhile, the number of processing units 16 is predetermined in the case where the second regulation valve 171 begins to open in a state in which the opening degree of the first regulation valve 151 remains at the predetermined opening degree $\alpha$. That is, when the number of processing units 16 is equal to or above a predetermined number (i.e., when the sum of the opening/closing mechanisms 200 that are open is equal to or above a predetermined number), the opening degree of the first regulation valve 151 is changed in a state in which the second regulation valve 171 is closed. When the number of processing units 16 is less than the predetermined number (i.e., when the sum of the opening/closing mechanisms 200 that are open is less than the predetermined number), the opening degree of the second regulation valve 171 is changed in a state in which the first regulation valve 151 remains at the opening degree. Thereby, as described above in the first exemplary embodiment, outside air is introduced from the second outside air intake section 161 into the dedicated common exhaust path 121, and thus the exhaust amount of the communicating processing units 16 is hardly increased, which may suppress pressure fluctuation (see, e.g., FIG. 7C).

As described above, the opening degree information 19b is information in which the state of the opening/closing mechanism 200 (in other words, the number of communicating processing units 16) is associated with the opening degrees of the first regulation valve 151 and the second regulation valve 171 corresponding to the state of the opening/closing mechanism 200. Meanwhile, as described above, in a state in which the opening degree of the second regulation valve 171 is zero, the opening degree of the first regulation valve 151 is increased stepwise to a set opening degree, and thereafter, the opening degree of the second regulation valve 171 is increased. In addition, in a state in which the opening degree of the first regulation valve 151 is zero, the opening degree of the second regulation valve 171 may be increased stepwise to a set opening degree, and thereafter, the opening degree of the first regulation valve 151 may be increased.

7. Specific Operation of Substrate Processing System According to Second Exemplary Embodiment FIG. 11 is a flowchart illustrating an exemplary processing sequence of an exhaust processing executed in the substrate processing system 1 according to the second exemplary embodiment.

As illustrated in FIG. 11, the opening/closing mechanism controller 18a of the controller 18 controls the opening/closing mechanism 200 based on the kind of a processing liquid used in the processing unit 16 (Step S201). Subsequently, the state detection unit 18c detects the state of the opening/closing mechanism 200 (Step S202a).

Subsequently, the valve controller 18b controls the first regulation valve 151 and the second regulation valve 171 based on the detected state of the opening/closing mechanism 200 (Step S203a). Specifically, when a signal indicating the detected state of the opening/closing mechanism 200 is input from the state detection unit 18c, the valve controller 18b reads the opening degree information 19b from the storage unit 19. The opening degree information 19b is, for example, the opening degrees of the first regulation valve 151 and the second regulation valve 171, which are preset via tests. Specifically, the opening degree information 19b is information in which the state of the opening/closing mechanism 200 is associated with the opening degrees of the first regulation valve 151 and the second regulation valve 171.

In addition, the valve controller 18b controls the first and second regulation valves 151 and 171 based on the state of the opening/closing mechanism 200 and the opening degree information 19b. By this, outside air is appropriately introduced from the first outside air intake section 141 or the second outside air intake section 161 into the dedicated common exhaust path 121, thereby suppressing pressure fluctuation in the processing units 16.

Meanwhile, because the descriptions of the first regulation valve 151 or the second regulation valve 171 may also be applied to the first regulation valves 152 and 153 or the second regulation valves 172 and 173, descriptions for the control of the first regulation valves 152 and 153 or the second regulation valves 172 and 173 will be omitted.

As described above, in the second exemplary embodiment, because the first regulation valves 151 to 153 and the second regulation valves 171 to 173 are controlled based on the state of the opening/closing mechanism 200, the pressure fluctuation in the processing units 16 may be effectively suppressed.

In addition, in the second exemplary embodiment, the opening degree information 19b previously stored in the storage unit 19, is used. By this, the opening degrees of the first regulation valves 151 to 153 and the second regulation valves 171 to 173 may be simply controlled in early stages.

Meanwhile, the opening degree information 19b may include information in which the positional relationship of the opening/closing mechanism 200 relative to the first regulation valve 151 is associated with the opening degree of the first regulation valve 151.

In addition, in the opening degree information 19b, for example, when the processing units 16, which are not in communication because the opening/closing valve of the opening/closing mechanism 200 is closed, are two processing units (the fourth and fifth processing units 16d and 16e), which have the positional relationship of being close to the first regulation valve 151 (see, e.g., FIG. 7B), the opening degree of the first regulation valve 151 is set to the predetermined opening degree α. Meanwhile, here, "the positional relationship of being close to the first regulation valve 151" means a close position in the flow direction of exhaust gas.

In addition, in the opening degree information 19b, for example, when the processing unit 16, which is not in communication, is the fifth processing unit 16e, which has the positional relationship of being the closest to the first regulation valve 151, the opening degree of the first regulation valve 151 is set to the second predetermined opening degree α0. Meanwhile, the opening degree of the first regulation valve 151 is merely given by way of example and is not limited thereto, and is appropriately set via, for example, tests in consideration of the positional relationship of the opening/closing mechanism 200 relative to the first regulation valve 151.

In addition, the valve controller 18b controls the opening degree of the first regulation valve 151 based on the opening degree information 19b and the positional relationship of the opening/closing mechanism 200, the state of which is detected by the state detection unit 18c. By this, it is possible to properly control the opening degree of the first regulation valve 151 based on the positional relationship of the processing unit 16 with the opening/closing mechanism 200, the state of which is detected. It is also possible to further suppress the pressure fluctuation in each processing unit 16. Meanwhile, the other effects are the same as those of the first exemplary embodiment, and thus a description thereof is omitted.

Meanwhile, the predetermined opening degree α or the second predetermined opening degree α0 has the same value in the first regulation valves 151 to 153 and the second regulation valves 171 to 173 in the exemplary embodiment. However, without being limited thereto, and the predetermined opening degree α or the second predetermined opening degree α0 may have different values.

In addition, in the opening degree information 19b of the second exemplary embodiment, the opening degrees of the first regulation valves 151 to 153 or the second regulation valves 171 to 173 are set to correspond to the number of communicating processing units 16, but are not limited thereto. That is, the opening degrees of the first regulation valves 151 to 153 or the second regulation valves 171 to 173 may be set so as to correspond to the distance (position) from, for example, the first outside air intake sections 141 to 143 of the communicating processing units 16 or the opening degree of the opening/closing mechanism 200.

In addition, it has been described above that the processing station 3 is controlled by the control device 4 provided in the substrate processing system 1. However, the processing station 3 is not limited thereto, and, for example, the processing station 3 may be configured to include the control device 4 therein.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a plurality of liquid processing units configured to perform a liquid processing on a processing target object by supplying a processing liquid to the processing target object;
   a plurality of individual exhaust paths, each connected to one of the liquid processing units at one end thereof so that an exhaust gas from interior of the liquid processing units flows in the individual exhaust paths;
   a common exhaust path to which another end of each of the individual exhaust paths is connected so that the exhaust gas from each of the individual exhaust paths flows in the common exhaust path;
   a first outside air intake section formed at a most upstream side, in the common exhaust path in a flow direction of the exhaust gas, from a plurality of connection regions, to which the individual exhaust paths are connected, and configured to introduce outside air into the common exhaust path;
   a first regulation valve provided between the first outside air intake section and the connection region, which is located at a most upstream side among the connection regions, and configured to regulate a flow rate of the outside air introduced from the first outside air intake section;
   a second outside air intake section formed at a downstream side from the common exhaust path than the connection region, which is located at the most upstream side among the connection regions, and configured to introduce outside air into the common exhaust path;
   a second regulation valve provided in the second outside air intake section and configured to regulate a flow rate of the outside air introduced from the second outside air intake section;
   an exhaust amount detection unit configured to detect exhaust amounts of the individual exhaust paths; and
   a valve controller configured, when a sum of the exhaust amounts of the plurality of individual exhaust paths, which are integrated by the exhaust amount detection unit, is equal to or more than a preset exhaust amount, to open one of the first regulation valve and the second regulation valve in a state where a remaining one is closed, and, when the sum of the exhaust amounts of the individual exhaust paths is less than the preset exhaust amount, to open the first regulation valve and the second regulation valve.

2. The apparatus of claim 1, wherein the second outside air intake section is formed at a downstream side of the common exhaust path from the connection region, which is located at a most downstream side in the flow direction of the exhaust gas among the connection regions.

3. The apparatus of claim 1, wherein the valve controller is configured, when the sum of the exhaust amounts of the individual exhaust paths, which are detected by the exhaust amount detection unit, is equal to or above the preset exhaust amount, to change an opening degree of the first regulation valve based on the sum of the exhaust amounts of the individual flow paths, and, when the sum of the exhaust amounts of the individual exhaust paths is less than the preset exhaust amount, to change an opening degree of the second regulation valve based on the sum of the exhaust amounts of the individual exhaust paths in a state where the opening degree of the first regulation valve is maintained.

4. The apparatus of claim 1, further comprising:
   an opening/closing mechanism provided in each individual exhaust path to open/close the individual exhaust path;
   a state detection unit configured to detect a state of the opening/closing mechanism; and
   wherein the valve controller is configured to control opening degrees of the first regulation valve and the second regulation valve based on the state of the opening/closing mechanism detected by the state detection unit.

5. The apparatus of claim 4, further comprising:
   a storage unit configured to store in advance, as opening degree information, the state of the opening/closing mechanism and the opening degrees of the first regulation valve and the second regulation valve corresponding to the state of the opening/closing mechanism, by associating the state and the opening degrees with each other,
   wherein the valve controller is configured to control the opening degrees of the first regulation valve and the second regulation valve based on the state of the opening/closing mechanism detected by the state detection unit and the opening degree information stored in the storage unit.

6. The apparatus of claim 5, wherein the opening degree information includes information in which a positional relationship of the opening/closing mechanism relative to the first regulation valve is associated with the opening degree of the first regulation valve, and
   the valve controller is configured to control the opening degree of the first regulation valve based on the positional relationship of the opening/closing mechanism of which the state is detected by the state detection unit, and the opening degree information stored in the storage unit.

7. The apparatus according to of claim 1, wherein the second regulation valve is located at a position where a flow direction of the outside air introduced through the second outside air intake section is orthogonal to the flow direction of the exhaust gas at a position of the common exhaust path where the second outside air intake section is formed.

8. The apparatus of claim 1, wherein the liquid processing units are configured to supply a plurality of kinds of processing liquids to the processing target object, and
   there is provided a plurality of common exhaust paths to correspond to the kinds of processing liquids, and an outflow point of the exhaust gas flowing through each of the individual flow paths is switched to any one of the common exhaust paths depending on the kinds of processing liquids.

9. The apparatus claim 1, wherein at least one of the first outside air intake section and the second outside air intake section is configured to introduce, as the outside air, atmospheric gas around the liquid processing units.

10. The apparatus of claim 5, wherein the valve controller is configured, when the sum of the number of opening/ closing mechanisms that are open is equal to or larger than a predetermined number, to change the opening degree of the first regulation valve based on a sum of the number of opening/closing mechanisms that are opened in a state where the second regulation valve is closed, and, when the sum of the number of opening/closing mechanisms that are open is less than the predetermined number, to change the opening degree of the second regulation valve in a state where the opening degree of the first regulation valve is maintained.

* * * * *